(12) United States Patent
Moriya et al.

(10) Patent No.: US 11,037,927 B2
(45) Date of Patent: Jun. 15, 2021

(54) CIRCUIT DEVICE AND ELECTRONIC APPARATUS

(71) Applicant: SEIKO EPSON CORPORATION, Tokyo (JP)

(72) Inventors: Isamu Moriya, Chino (JP); Atsushi Yamada, Nagoya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 6 days.

(21) Appl. No.: 16/361,846

(22) Filed: Mar. 22, 2019

(65) Prior Publication Data

US 2019/0221566 A1   Jul. 18, 2019

Related U.S. Application Data

(62) Division of application No. 14/191,893, filed on Feb. 27, 2014, now abandoned.

(30) Foreign Application Priority Data

Mar. 4, 2013   (JP) ................................. 2013-041807

(51) Int. Cl.
| | |
|---|---|
| H01L 27/092 | (2006.01) |
| H01L 21/8238 | (2006.01) |
| H01L 21/761 | (2006.01) |
| H01L 29/06 | (2006.01) |
| H03K 17/082 | (2006.01) |
| H02M 7/5387 | (2007.01) |

(52) U.S. Cl.
CPC ........ *H01L 27/0928* (2013.01); *H01L 21/761* (2013.01); *H01L 21/823878* (2013.01); *H01L 21/823892* (2013.01); *H01L 29/0646* (2013.01); *H03K 17/0822* (2013.01); *H01L 21/82385* (2013.01); *H01L 21/823814* (2013.01); *H02M 7/53871* (2013.01); *H03K 2217/0027* (2013.01); *H03K 2217/0045* (2013.01)

(58) Field of Classification Search
CPC ............. H01L 29/0646; H01L 27/0928; H01L 21/761; H01L 27/0705; H01L 21/76; H01L 21/823481; H01L 21/823878
See application file for complete search history.

(56) References Cited

U.S. PATENT DOCUMENTS

| | | | |
|---|---|---|---|
| 6,359,318 B1 | 3/2002 | Yamamoto et al. | |
| 7,067,899 B2 * | 6/2006 | Kanda ................. | H01L 27/0821 257/556 |

(Continued)

FOREIGN PATENT DOCUMENTS

| | | |
|---|---|---|
| CN | 1723601 A | 1/2006 |
| JP | 2000-077532 A | 3/2000 |

(Continued)

*Primary Examiner* — Jesse Y Miyoshi
(74) *Attorney, Agent, or Firm* — Oliff PLC

(57) ABSTRACT

An electronic circuit includes a noise source and an analog circuit and a logic circuit that may be adversely affected by noise. At least a portion of the analog circuit and the logic circuit is formed on a buried impurity layer whose conductivity is different from that of a substrate, and at least a portion of the periphery of that portion is surrounded by an impurity layer that is different from the substrate. Thus, propagation of the noise from the noise source is prevented.

17 Claims, 13 Drawing Sheets

(56) References Cited

U.S. PATENT DOCUMENTS

| | | |
|---|---|---|
| 7,112,932 B2 | 9/2006 | Krenzke et al. |
| 7,411,271 B1 | 8/2008 | Ma et al. |
| 2004/0032005 A1 | 2/2004 | Williams et al. |
| 2004/0033666 A1 | 2/2004 | Williams et al. |
| 2004/0063291 A1 | 4/2004 | Williams et al. |
| 2005/0014324 A1 | 1/2005 | Williams et al. |
| 2005/0014329 A1 | 1/2005 | Williams et al. |
| 2005/0142724 A1 | 6/2005 | Williams et al. |
| 2005/0142791 A1 | 6/2005 | Williams et al. |
| 2005/0158939 A1 | 7/2005 | Williams et al. |
| 2005/0179093 A1 | 8/2005 | Morris |
| 2005/0253191 A1 | 11/2005 | Pendharkar et al. |
| 2005/0269597 A1 | 12/2005 | Williams et al. |
| 2005/0272207 A1 | 12/2005 | Williams et al. |
| 2005/0272230 A1 | 12/2005 | Williams et al. |
| 2006/0001102 A1 | 1/2006 | Pendharkar |
| 2006/0054967 A1 | 3/2006 | Ludikhuize et al. |
| 2006/0133189 A1 | 6/2006 | Sung et al. |
| 2006/0223257 A1 | 10/2006 | Williams et al. |
| 2006/0249759 A1 | 11/2006 | Morris |
| 2008/0042232 A1 | 2/2008 | Williams et al. |
| 2008/0173951 A1* | 7/2008 | Ma ................ H01L 27/0922 257/372 |
| 2008/0188045 A1 | 8/2008 | Morris |
| 2008/0191277 A1 | 8/2008 | Disney et al. |
| 2008/0197408 A1 | 8/2008 | Disney et al. |
| 2008/0197445 A1 | 8/2008 | Disney et al. |
| 2008/0197446 A1 | 8/2008 | Disney et al. |
| 2008/0210980 A1 | 9/2008 | Disney et al. |
| 2008/0213972 A1 | 9/2008 | Disney et al. |
| 2008/0217699 A1 | 9/2008 | Disney et al. |
| 2008/0217729 A1 | 9/2008 | Disney et al. |
| 2008/0230812 A1 | 9/2008 | Disney et al. |
| 2008/0237656 A1 | 10/2008 | Williams et al. |
| 2008/0237704 A1 | 10/2008 | Williams et al. |
| 2008/0237706 A1 | 10/2008 | Williams et al. |
| 2008/0237782 A1 | 10/2008 | Williams et al. |
| 2008/0237783 A1 | 10/2008 | Williams et al. |
| 2008/0290410 A1 | 11/2008 | Huang et al. |
| 2008/0290452 A1 | 11/2008 | Williams et al. |
| 2008/0293214 A1 | 11/2008 | Williams et al. |
| 2009/0079272 A1 | 3/2009 | Ludikhuize et al. |
| 2009/0236683 A1 | 9/2009 | Williams et al. |
| 2010/0032756 A1 | 2/2010 | Pendharkar et al. |
| 2010/0051946 A1 | 3/2010 | Jun |
| 2010/0133611 A1 | 6/2010 | Disney et al. |
| 2010/0301413 A1* | 12/2010 | You ................ H01L 27/0922 257/343 |
| 2011/0012196 A1 | 1/2011 | Williams et al. |
| 2011/0188163 A1 | 8/2011 | Ando |
| 2011/0201171 A1 | 8/2011 | Disney et al. |
| 2011/0260246 A1 | 10/2011 | Disney et al. |
| 2012/0108045 A1 | 5/2012 | Morris |
| 2012/0112240 A1 | 5/2012 | Takeda et al. |
| 2013/0105904 A1* | 5/2013 | Roybal ........... H01L 21/823892 257/369 |
| 2013/0265086 A1 | 10/2013 | Chang et al. |
| 2013/0270606 A1 | 10/2013 | Chen et al. |
| 2013/0313620 A1 | 11/2013 | Morris |

FOREIGN PATENT DOCUMENTS

| | | |
|---|---|---|
| JP | 2003-142685 A | 5/2003 |
| JP | 2005-536060 A | 11/2005 |
| JP | 2007-523481 A | 8/2007 |
| JP | 200842975 A | 2/2008 |
| JP | 2010-522986 A | 7/2010 |
| JP | 2011-160598 A | 8/2011 |
| JP | 2012-80117 A | 4/2012 |
| JP | 2012-099749 A | 5/2012 |
| TW | 201011910 A | 3/2010 |
| TW | 1352428 B | 11/2011 |

* cited by examiner

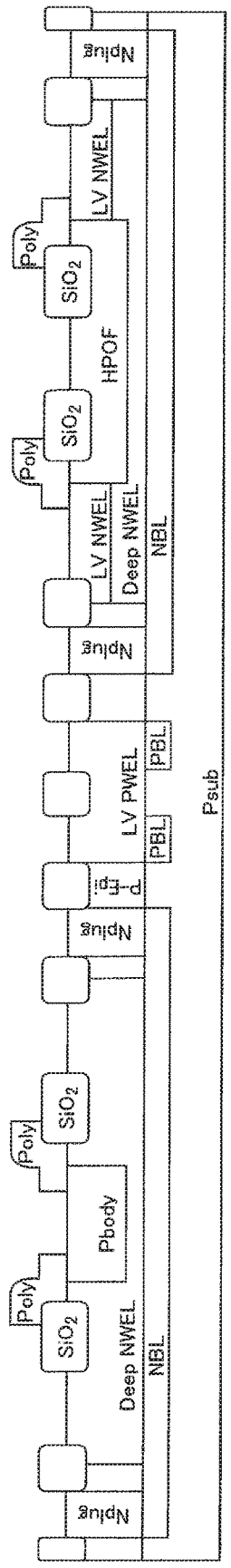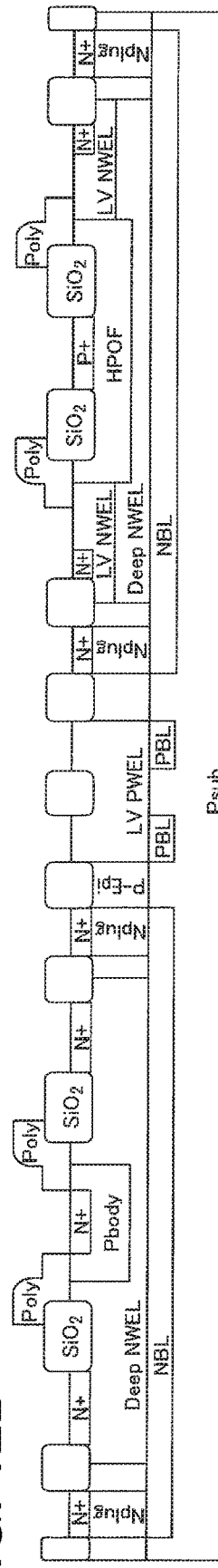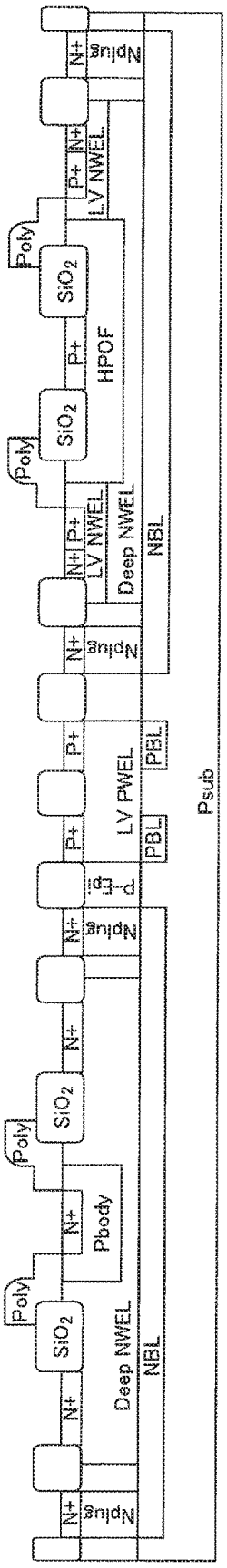

CIRCUIT DEVICE AND ELECTRONIC APPARATUS

CROSS REFERENCE

This is a Divisional of application Ser. No. 14/191,893, filed Feb. 27, 2014, which claims priority of Japanese Patent Application No. 2013-041807, filed Mar. 4, 2013. The disclosures of the prior applications are hereby incorporated by reference herein in their entirety.

BACKGROUND

1. Technical Field

The present invention relates to a circuit device and an electronic apparatus or the like.

2. Related Art

A technique of controlling the number of revolutions of a motor by controlling a chopping current is known as a technique for a motor driver that drives a DC motor. In this technique, a current flowing to a bridge circuit is converted to a voltage by a sense resistor, and the resultant voltage is compared with a reference voltage, to detect a chopping current. The detection result is fed back to a control circuit, to perform PWM control of a drive signal for the bridge circuit, thereby rotating a motor at a fixed rate.

For example, JP-A-2008-042975 discloses a technique of improving the precision of detection of the chopping current in such a motor driver. In this technique, a sense resistor is provided for each half bridge of an H-bridge, where one resistor detects that the current in the charge period has reached a predetermined current, and the other resistor detects that the current in the decay period has reached a predetermined current.

Not only in a motor driver as described above, but in any circuit that performs switching operation, on/off of the current is repeated by the switching operation, and this causes a problem that the potential of a substrate fluctuates. The potential fluctuation of the substrate may affect the operation of a circuit that is formed on the substrate.

For example, in a motor driver as described above, a large current is required to drive the motor, and on/off of the current is repeated by chopping operation. Therefore, the potential of the substrate of the motor driver fluctuates. A reference voltage generation circuit and a voltage detection circuit formed on the substrate are affected by the potential fluctuation, causing variations in the detection value of the chopping current. This then results in a decrease in the precision of the rotational speed of the motor that is controlled so as to be constant.

SUMMARY

An advantage of some aspects of the invention is providing a circuit device and an electronic apparatus or the like where the effect of the potential fluctuation of a substrate on the operation of a circuit can be reduced.

A first aspect of the invention relates to a circuit device including a first circuit constituted by a transistor that has a DMOS structure and is formed on a first N-type buried layer on a P-type substrate, and a second circuit constituted by a transistor that has a CMOS structure and is formed on a second N-type buried layer isolated from the first N-type buried layer.

According to the first aspect of the invention, the second circuit constituted by the CMOS transistor is formed on the second N-type buried layer isolated from the first N-type buried layer, so that the second circuit is isolated from the P-type substrate by the second N-type buried layer. Thus, the effect of the potential fluctuation of the substrate on the circuit operation can be reduced.

It is preferable that a region of the second circuit be surrounded by an N-type plug region that sets a potential of the second N-type buried layer.

With this configuration, the second circuit can be isolated from the P-type substrate by the second N-type buried layer and the N-type plug region surrounding the second N-type buried layer. Also, since the potential of the N-type buried layer is set by the N-type plug region, the second circuit can be electrically isolated from the P-type substrate.

It is preferable that the transistor having the CMOS structure be formed on a P-type layer that is formed on the second N-type buried layer.

With this configuration, the P-type layer that is isolated from the P-type substrate by the second N-type buried layer can be formed, and the second circuit constituted by the CMOS transistor can be formed on the isolated P-type layer.

It is preferable that the P-type layer be an epitaxial layer.

With this configuration, a P-type buried layer can be formed as the P-type layer isolated from the P-type substrate by forming an epitaxial layer on the second N-type buried layer.

It is preferable that the circuit device further include a pad through which a potential of the P-type substrate is supplied, a first interconnect for supplying a potential from the pad to the P-type layer, and a second interconnect for supplying a potential from the pad to the P-type substrate.

With this configuration, a potential can be supplied to the P-type layer isolated from the P-type substrate via a different interconnect (first interconnect) than that for the P-type substrate. Thus, conveyance of the potential fluctuation from the P-type substrate to the P-type layer via the interconnect can be prevented or reduced.

It is preferable that a P-type transistor of the transistor having the CMOS structure be constituted by an N-type well formed on the P-type layer, a P-type source region formed on the N-type well, and a P-type drain region formed on the N-type well, and an N-type transistor of the transistor having the CMOS structure be constituted by a P-type well formed on the P-type layer, an N-type source region formed on the P-type well, and an N-type drain region formed on the P-type well.

With this configuration, the second circuit constituted by the N-type transistor of the CMOS structure and the P-type transistor of the CMOS structure can be formed on the second N-type buried layer isolated from the first N-type buried layer.

It is preferable that an N-type transistor of the transistor having the DMOS structure have a deep N-type well formed on the first N-type buried layer, a P-type layer formed on the deep N-type well, an N-type source region formed on the P-type layer, and an N-type drain region formed on the deep N-type well.

It is preferable that a P-type transistor of the transistor having the DMOS structure have a deep N-type well formed on the first N-type buried layer, a P-type layer formed on the deep N-type well, a P-type source region formed on the deep N-type well, and a P-type drain region formed on the P-type layer.

With these configurations, the first circuit constituted by the N-type transistor of the DMOS structure or the P-type transistor of the DMOS structure can be formed on the first N-type buried layer.

It is preferable that the first circuit have a bridge circuit that outputs a chopping current for driving a motor, and the second circuit have a detection circuit that detects a current flowing to the bridge circuit.

With this configuration, a motor drive circuit that drives the motor with the chopping current can be formed of the bridge circuit and the detection circuit. Even though the switching operation of the bridge circuit causes the potential of the P-type substrate to fluctuate, detection errors of the chopping current can be reduced because the detection circuit can be isolated by the second N-type buried layer.

It is preferable that the detection circuit have a reference voltage generation circuit that generates a reference voltage, a voltage detection circuit that compares a voltage based on the current with the reference voltage, and a control circuit that controls the bridge circuit based on a comparison result of the voltage detection circuit.

With this configuration, the chopping current flowing to the motor can be controlled so as to be constant by comparing the voltage based on the chopping current with the reference voltage.

It is preferable that the second circuit have a circuit that controls the first circuit or a circuit that detects a voltage or a current of the first circuit.

With this configuration, the circuit that controls the first circuit or the circuit that detects the voltage or current of the first circuit can be isolated from the P-type substrate. Thus, the first circuit can be controlled precisely, or the voltage or current of the first circuit can be detected precisely.

It is preferable that the first circuit be a circuit that performs an operation of repeatedly switching an output current or an output voltage.

With this configuration, even if the switching operation performed by the first circuit causes the potential of the P-type substrate to fluctuate, the effect of the switching operation on the second circuit can be prevented or reduced because the second circuit is isolated from the P-type substrate.

A second aspect of the invention relates to an electronic apparatus including the circuit device described above.

BRIEF DESCRIPTION OF THE DRAWINGS

The invention will be described with reference to the accompanying drawings, wherein like numbers reference like elements.

FIGS. 12A to 12C show a process flow for manufacturing the transistor having the DMOS structure.

DESCRIPTION OF EXEMPLARY EMBODIMENTS

The following describes in detail a preferred embodiment of the invention. It should be noted that the embodiment to be described hereinafter is not intended to unduly limit the scope of the invention defined by the appended claims and that the entire configuration to be described in the embodiment is not necessarily essential as the means for achieving the invention.

1. Configuration of Substrate of Comparative Example

Figure 1:
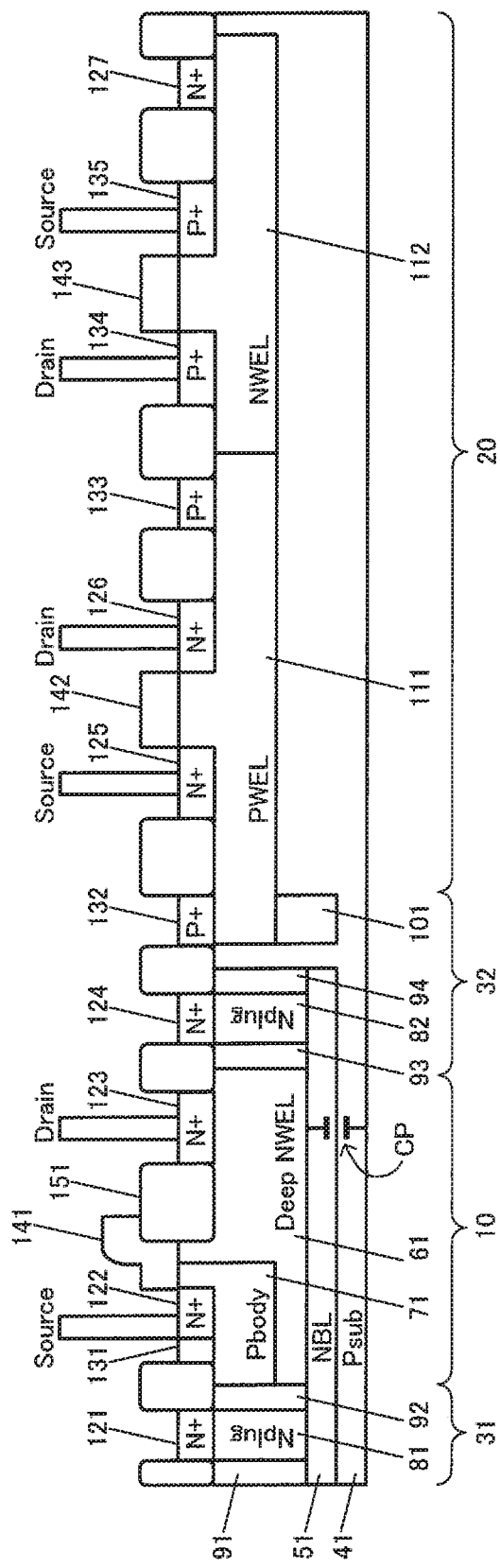
FIG. 1 shows the configuration of a substrate of a comparative example of an embodiment of the invention.

FIG. 1 shows the configuration of a substrate of a comparative example of this embodiment. FIG. 1 is a cross-sectional view of a substrate of an integrated circuit device constituting a circuit device.

It should be noted that although a case where the circuit device is a motor driver as described later with reference to FIG. 3, for example, will be described as an example below, this embodiment is not limited to this, but can be applied to various types of circuit devices that perform switching operation of a drive current or a drive voltage. For example, this embodiment may also be applied to a switching regulator or the like that generates a desired voltage by driving an LC resonant circuit by switching a transistor.

Arranged on a substrate are a first region 10 where a first circuit is placed, a second region 20 where a second circuit is placed, a boundary region 31 provided at one end of the first region 10, and a boundary region 32 provided between the first region 10 and the second region 20. The first circuit is a bridge circuit (e.g., a bridge circuit 210 in FIG. 3) constituted by a double-diffused metal oxide semiconductor (DMOS) transistor. Note that the first circuit is not limited to a bridge circuit, but any circuit that performs the switching operation of a drive current can be used. The second circuit is a circuit (e.g., a detection circuit 250 in FIG. 3) constituted by a complementary metal oxide semiconductor (CMOS) transistor.

Here, a direction (thickness direction) perpendicular to the plane of the substrate and toward a side of the substrate on which a circuit is to be formed (the side on which various layers are to be deposited by a semiconductor process) is referred to as "upward", and the reverse direction is referred to as "downward".

In the first region 10, an N-type transistor having a DMOS structure (hereinafter referred to as an N-type DMOS) is formed. More specifically, an N-type (N+) buried layer (NBL) 51 is formed on a P-type substrate 41 that is a silicon substrate, and a deep N-type well 61 of the N-type DMOS is formed on the N-type buried layer 51. A P-type body 71 (P-type impurity layer) is formed on the source side of the deep N-type well 61, and a P-type layer 131 (P-type impurity layer) and an N-type layer 122 (N-type impurity layer) are formed on the P-type body 71. The N-type layer 122 corresponds to the source region of the N-type DMOS. An N-type layer 123 corresponding to the drain region of the N-type DMOS is formed on the drain side of the deep N-type well 61. An insulating layer 151 (e.g., LOCOS) is formed on the deep N-type well 61 so as to be in contact with the N-type layer 123, and a gate layer 141 (e.g., a polysilicon layer) is formed above the P-type body 71, the deep N-type well 61, and the insulating layer 151.

In the boundary region 31, an N-type plug 81 (N-type impurity layer) for supplying a potential to the N-type buried layer 51 is provided. More specifically, the N-type plug 81 is formed on the N-type buried layer 51, P-type layers 91 and 92 are formed on both sides of the N-type plug 81, and an N-type layer 121 is formed on the N-type plug 81. The potential given to the N-type layer 121 is thus supplied to the N-type buried layer 51 via the N-type plug 81. A ground voltage (low-potential side power supply voltage in a broad sense) is supplied to the N-type layer 121.

In a part of the boundary region 32 closer to the first region 10, an N-type plug 82 for supplying a potential to the N-type buried layer 51 is provided. The configuration of the N-type plug 82 is similar to that of the N-type plug 81. In another part of the boundary region 32 closer to the second region 20, a P-type (P+) buried layer (PBL) 101 for supplying a potential to the P-type substrate 41 is provided. More specifically, the P-type buried layer 101 is formed on the P-type substrate 41, a P-type well 111 is formed on the P-type buried layer 101, and a P-type layer 132 is formed on the P-type well 111. The potential given to the P-type layer 132 is supplied to the P-type substrate 41 via the P-type well 111 and the P-type buried layer 101. The ground voltage (low-potential side power supply voltage in a broad sense), for example, is supplied to the P-type layer 132.

In the second region 20, an N-type transistor (hereinafter referred to as an NMOS) and a P-type transistor (hereinafter referred to as a PMOS) of a CMOS structure are formed. More specifically, the P-type well 111 (e.g., a medium-voltage P-type well (MV PWELL)) of the NMOS is formed on the P-type substrate 41, and an N-type layer 125 and an N-type layer 126 are formed on the P-type well 111 as the N-type source region and the N-type drain region, respectively, of the NMOS. A gate layer 142 is formed above the P-type well 111 between the N-type layers 125 and 126. A P-type layer 133 for supplying a potential to the P-type well 111 is further formed on the P-type well 111. The ground voltage (low-potential side power supply voltage in a broad sense), for example, is supplied to the P-type layer 133.

An N-type well 112 (e.g., a medium-voltage N-type well (MV NWELL)) of the PMOS is formed on the P-type substrate 41, and a P-type layer 135 and a P-type layer 134 are formed on the N-type well 112 as the P-type source region and the drain region, respectively, of the PMOS. A gate layer 143 is formed above the N-type well 112 between the P-type layers 134 and 135. An N-type layer 127 for supplying a potential to the N-type well 112 is further formed on the N-type well 112. A power supply voltage (high-potential side power supply voltage), for example, is supplied to the N-type layer 127.

It should be noted that insulating layers (LOCOS) for insulation from an adjacent impurity layer are provided between the impurity layers (the N-type layers and the P-type layers) in a surface portion of the substrate, although reference numerals thereof in the drawings and a description thereof are omitted.

When the bridge circuit constituted by the DMOS transistors drives the motor with a chopping current, a large current flows to the drain (N-type layer 123) of the DMOS transistor. Since the large current is turned on/off (or the direction of the flow is reversed) by the chopping operation, the voltage of the drain largely fluctuates. The N-type layer 123 as the drain is connected to the N-type buried layer 51 via the deep N-type well 61, and a parasitic capacitance CP is present between the N-type buried layer 51 and the P-type substrate 41 due to their PN junction. Therefore, the voltage fluctuation at the drain is conveyed to the P-type substrate 41 via the parasitic capacitance CP, and then to the second region 20 via the P-type substrate 41. In the second region 20, where the P-type substrate 41 is in contact with the P-type well 111 and the N-type well 112 of the CMOS transistor, the voltage fluctuation of the P-type substrate 41 affects the circuit constituted by the CMOS transistor.

Figure 3:
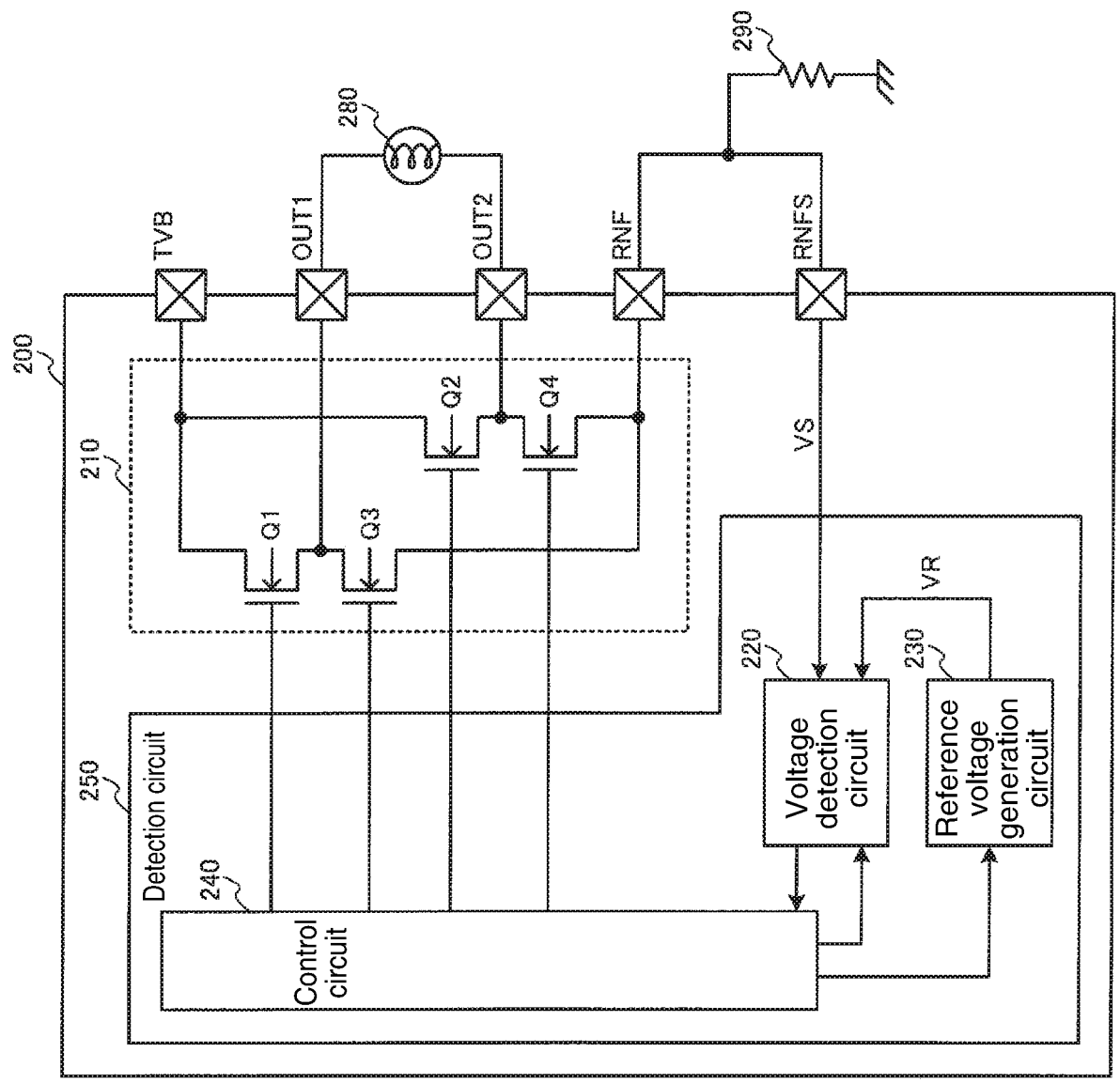
FIG. 3 shows an example configuration of a circuit device.

For example, in the motor driver in FIG. 3, a voltage detection circuit 220 compares a voltage VS at one terminal of a sense resistor 290 with a reference voltage VR, thereby keeping the chopping current flowing to the bridge circuit 210 constant. At this time, if the voltage detection circuit 220 and a reference voltage generation circuit 230 are affected by the voltage fluctuation of the P-type substrate 41, the reference voltage VR will fluctuate and the comparison precision of the voltage detection circuit 220 will decrease, raising the possibility of occurrence of variations in the chopping current.

Figure 5:
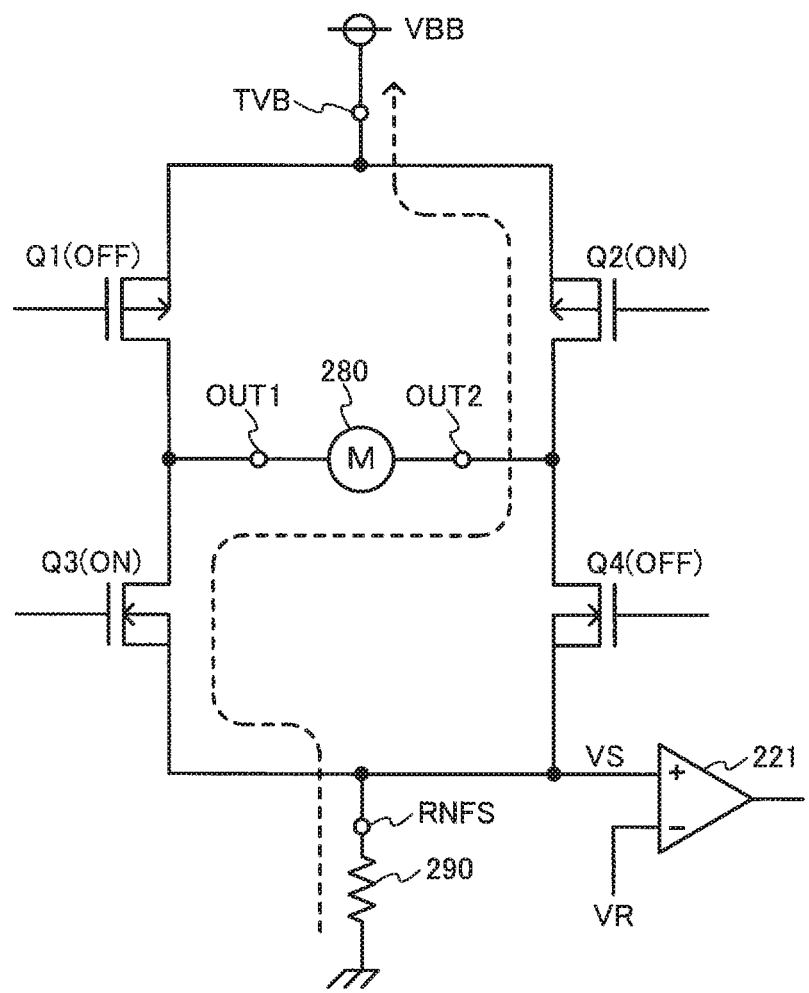
FIG. 5 is an explanatory diagram of the operation of the circuit device.

Also, as described later with reference to FIG. 5, a regenerative current flows from the ground voltage toward a power supply voltage VBB during the decay period. For this reason, the drain voltage of a DMOS transistor Q3 becomes lower than the ground voltage due to a voltage drop of the sense resistor 290. When this occurs, in the DMOS structure in FIG. 1, the N-type buried layer 51 connected to the drain becomes lower than the ground voltage, causing a forward voltage between the N-type buried layer 51 and the P-type substrate 41. The voltage of the P-type substrate 41 will therefore be swung with the current flowing into the P-type substrate 41. Thus, there is another cause of swinging of the voltage of the P-type substrate 41, in addition to the one occurring via the parasitic capacitance CP.

2. Configuration of Substrate According to Embodiment of the Invention

Figure 2:
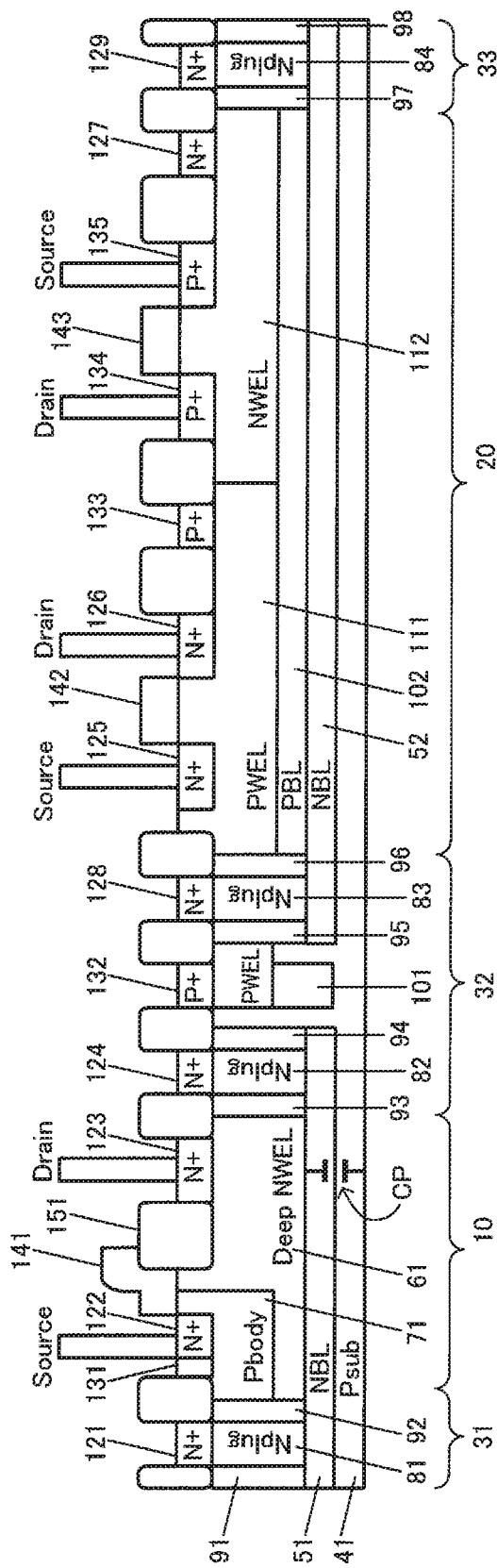
FIG. 2 shows an example configuration of a substrate according to the embodiment.

FIG. 2 shows an example configuration of a substrate according to this embodiment that can solve the problems as described above. FIG. 2 is a cross-sectional view of a substrate of an integrated circuit device constituting a circuit device (e.g., a circuit device 200 in FIG. 3).

On a substrate, arranged are a first region 10 where a first circuit is placed, a second region 20 where a second circuit is placed, a boundary region 31 provided at one end of the first region 10, a boundary region 32 provided between the first region 10 and the second region 20, and a boundary region 33 provided at one end of the second region 20. Since the configurations of the first region 10 and the boundary region 31 are similar to those in FIG. 1, a description of these regions is omitted here.

In the second region 20, an N-type buried layer 52 for isolating the CMOS transistor from the P-type substrate 41 is formed. More specifically, the N-type buried layer 52 is formed on the P-type substrate 41, and a P-type buried layer 102 is formed on the N-type buried layer 52. An NMOS transistor and a PMOS transistor are formed on the P-type buried layer 102. The configurations of these transistors are similar to those in FIG. 1.

In a part of the boundary region 32 closer to the first region 10, an N-type plug 82 is provided as in FIG. 1. In another part of the boundary region 32 closer to the second region 20, an N-type plug 83 for supplying a potential to the N-type buried layer 52 is provided. More specifically, the N-type plug 83 is formed on the N-type buried layer 52, P-type layers 95 and 96 are formed on both sides of the N-type plug 83, and an N-type layer 128 is formed on the N-type plug 83. The potential given to the N-type layer 128 is thus supplied to the N-type buried layer 52 via the N-type plug 83. The power supply voltage, for example, is supplied to the N-type layer 128.

In the boundary region 32, also, a P-type buried layer 101 for supplying a potential to the P-type substrate 41 is provided between the N-type plug 82 and the N-type plug 83. The configuration of the P-type buried layer 101 is similar to that in FIG. 1, where the ground voltage, for example, given to a P-type layer 132 is supplied to the P-type substrate 41 via a P-type well 111 and the P-type buried layer 101.

In the boundary region 33, an N-type plug 84 for supplying a potential to the N-type buried layer 52 is provided. The configuration of the N-type plug 84 is similar to that of the N-type plug 83 in the boundary region 32, where the power supply voltage, for example, given to an N-type layer 129 is supplied to the N-type buried layer 52 via the N-type plug 84.

According to the above-described embodiment, the circuit device 200 includes the first circuit (circuit that is formed in the first region 10) constituted by the transistor that has the DMOS structure and is formed on the first N-type buried layer 51 on the P-type substrate 41 and the second circuit (circuit that is formed in the second region 20) constituted by the transistor that has the CMOS structure and is formed on the second N-type buried layer 52 isolated from the first N-type buried layer 51.

With this configuration, having the second N-type buried layer 52 isolated from the first N-type buried layer 51, the second circuit constituted by the CMOS transistor can be isolated from the P-type substrate 41. When the DMOS transistor performs switching operation, the swing of the drain potential is conveyed from the first N-type buried layer 51 to the P-type substrate 41 via the parasitic capacitance CP, etc., as described in the comparative example shown in FIG. 1. In regard to the above, according to this embodiment, where the second circuit is isolated from the P-type substrate 41, even when the potential of the P-type substrate 41 swings, the second circuit is less likely to be affected by this swing, permitting operation with reduced errors.

The buried layer as used herein refers to an impurity layer formed below the impurity layers (e.g., the P-type body 71 and the deep N-type well 61 in FIG. 2) in the surface portion of the substrate. More specifically, as described later with reference to FIGS. 9A to 9E, an N-type impurity or a P-type impurity is implanted in the silicon substrate, and an epitaxial layer (silicon single-crystal layer) is grown on the impurity-implanted layer, to form a buried layer under the epitaxial layer.

In this embodiment, the region of the second circuit (second region 20) is surrounded by an N-type plug region (region where the N-type plugs 83 and 84 are provided as viewed from top) that sets the potential of the second N-type buried layer 52.

With the above configuration, a bathtub-shaped N-type region can be formed by the second N-type buried layer 52 and the N-type plug region surrounding the buried layer 52. By this N-type region, the region of the second circuit can be isolated from the P-type substrate 41. In addition, even if a swing of the potential of the P-type substrate is conveyed to the N-type buried layer 52, the second circuit region can be isolated without fail because the potential of the buried layer 52 has been set via the N-type plugs. There is also an advantage that, since the second N-type buried layer 52 can be set to a potential (e.g., a power supply voltage) higher than the P-type substrate 41, isolation can be ensured by reverse-voltage PN junction.

The region of a circuit as used herein refers to a region in which the circuit is placed when the substrate is viewed from top. That is to say, in a circuit layout, if the detection circuit 250 is constituted by one or more circuit blocks, the region of the detection circuit 250 refers to the region in which the layout block(s) is placed. For example, if the second circuit is the detection circuit 250 in FIG. 3, the region in which the detection circuit 250 is placed constitutes the region of the second circuit.

It should be noted that being "surrounded" by the N-type plug region is not limited to the case where the N-type plug region completely surround the periphery of the region (second region 20) of the second circuit when viewed from top, but may also include, for example, a case where the N-type plug region is partly broken (for example, the N-type plug region intermittently surrounds the periphery of that region). As shown in, for example, FIG. 2, the boundary region 32 includes the N-type plug 83. In the circuit device 200 shown in FIG. 3, the boundary region 32 may be provided so as to surround the periphery of the bridge circuit 210, for example. Alternatively, the boundary region 32 may be provided so as to isolate at least the bridge circuit 210 from the other circuits (detection circuit 250). In this case, the boundary region 32 is not necessarily required to be a continuous region when viewed from top, but may be partly discontinuous.

Moreover, in this embodiment, the transistor having the CMOS structure is formed on a P-type layer that is formed on the second N-type buried layer 52. For example, the P-type layer may be the P-type buried layer 102.

With this configuration, the P-type layer (P-type buried layer 102) that is isolated from the P-type substrate 41 by the second N-type buried layer 52 can be formed. Thus, the second circuit that is isolated from the primary P-type substrate 41 can be formed using that P-type layer (P-type buried layer 102) as a new P-type substrate.

Moreover, in this embodiment, the circuit device includes a pad (e.g., a pad connected to a terminal TVB in FIG. 3 described later) for supplying a potential of the P-type substrate 41, a first interconnect (e.g., aluminum interconnect formed on the semiconductor substrate) for supplying a potential from the pad to the P-type layer (P-type buried layer 102), and a second interconnect for supplying a potential from the pad to the P-type substrate 41.

With this configuration, the potential can be supplied to the P-type layer (P-type buried layer 102), which is isolated from the P-type substrate 41, via a different route (the first interconnect, the P-type layer 133, and the P-type well 111) than that to the P-type substrate 41. Thus, conveyance of the potential fluctuation from the P-type substrate 41 to the P-type layer (P-type buried layer 102) via the interconnect can be prevented or reduced.

The pad as used herein refers to a bonding pad formed on a semiconductor substrate. That is, the pad refers to a terminal that is included in the chip (integrated circuit device) and connected to a terminal of a package by, for example, a bonding wire or the like and that is for inputting/outputting a signal or a voltage between a circuit in the chip and an external circuit.

3. Motor Driver

FIG. 3 shows an example configuration of a motor driver as an example configuration of a circuit device to which the above-described substrate configuration is applicable. The circuit device 200 includes the bridge circuit 210 and the detection circuit 250. The detection circuit 250 includes the voltage detection circuit 220, the reference voltage generation circuit 230, and a control circuit 240. It should be noted that although a case where the entire circuit device is constituted by a single integrated circuit device will be described as an example below, the embodiment is not limited to this. In other words, it is also possible that a portion (e.g., the bridge circuit 210 and the voltage detection circuit 220) of the circuit device is constituted by a single integrated circuit device, and the substrate configuration in FIG. 2 is applied to this integrated circuit device.

The bridge circuit 210 drives an external motor 280 (DC motor) based on a PWM signal from the control circuit 240. More specifically, the bridge circuit 210 includes transistors Q1 to Q4 (DMOS transistors) arranged in an H-bridge. For example, the transistors Q1 to Q4 may be of N-type, or the transistors Q1 and Q2 may be of P-type and the transistors Q3 and Q4 be of N-type.

The transistor Q1 is provided between the terminal TVB to which the power supply voltage VBB is supplied and a terminal OUT1 to which one end of the motor 280 is connected. The transistor Q2 is provided between the terminal TVB and a terminal OUT2 to which the other end of the motor 280 is connected. The transistor Q3 is provided between the terminal OUT1 and a terminal RNF that is connected to one end of the sense resistor 290 that receives a ground voltage at the other end. The transistor Q4 is connected between the terminal OUT2 and the terminal RNF.

The reference voltage generation circuit 230 is constituted by, for example, a voltage divider circuit and generates a reference voltage VR for detecting a chopping current.

The voltage detection circuit 220 is constituted by, for example, a comparator and performs detection of the chopping current flowing through the bridge circuit 210. More specifically, the voltage detection circuit 220 compares a voltage VS at one end of the sense resistor 290 that is input via a terminal RNFS with the reference voltage VR. If the voltage detection circuit 220 detects that the voltage VS has reached the reference voltage VR, the voltage detection circuit 220 outputs a detection signal to the control circuit 240.

The control circuit 240 controls the chopping operation of the bridge circuit 210. More specifically, the control circuit 240 controls the pulse width of the PWM signal based on the detection signal from the voltage detection circuit 220 so as to keep the chopping current constant. Then, the control circuit 240 generates on/off control signals for the transistors Q1 to Q4 from the PWM signal and outputs the generated on/off control signals to the gates of the transistors Q1 to Q4.

Figure 4:
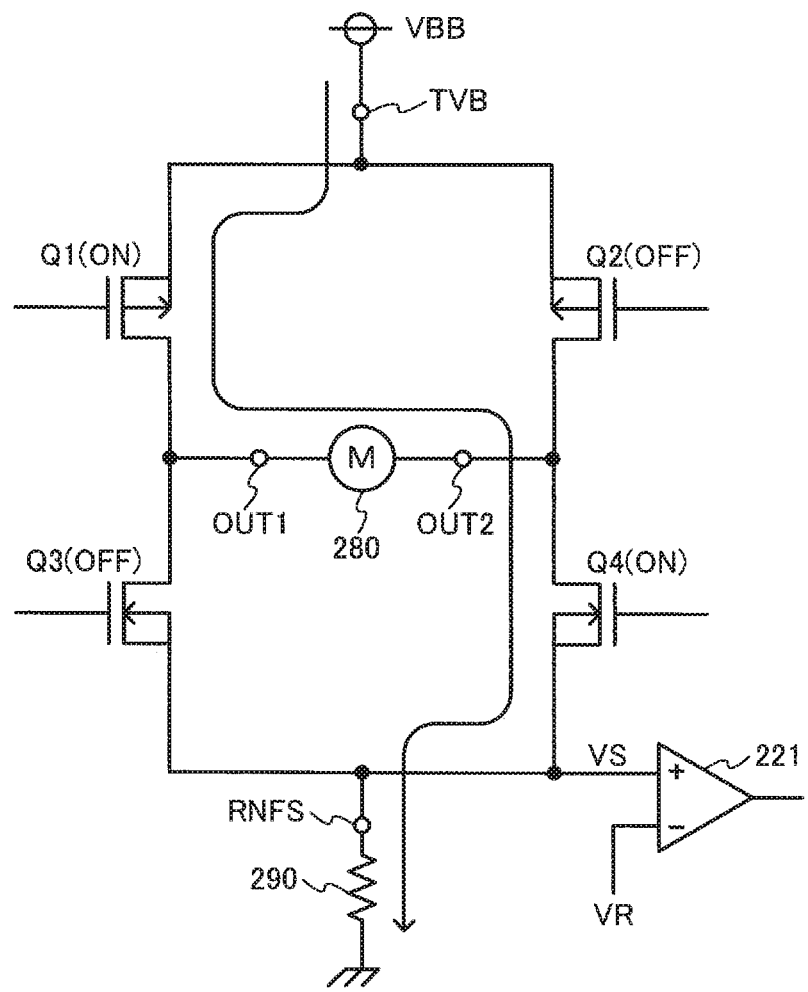
FIG. 4 is an explanatory diagram of the operation of the circuit device.

The operation of the circuit device 200 will be described in detail using FIGS. 4 to 6. It should be noted that a comparator 221 shown in FIG. 4 corresponds to the voltage detection circuit 220. The voltage VS at one end of the sense resistor 290 and the reference voltage VR are input to the positive input terminal and the negative input terminal, respectively, of the comparator 221. An output signal of the comparator 221 is output to the control circuit 240.

Figure 6:
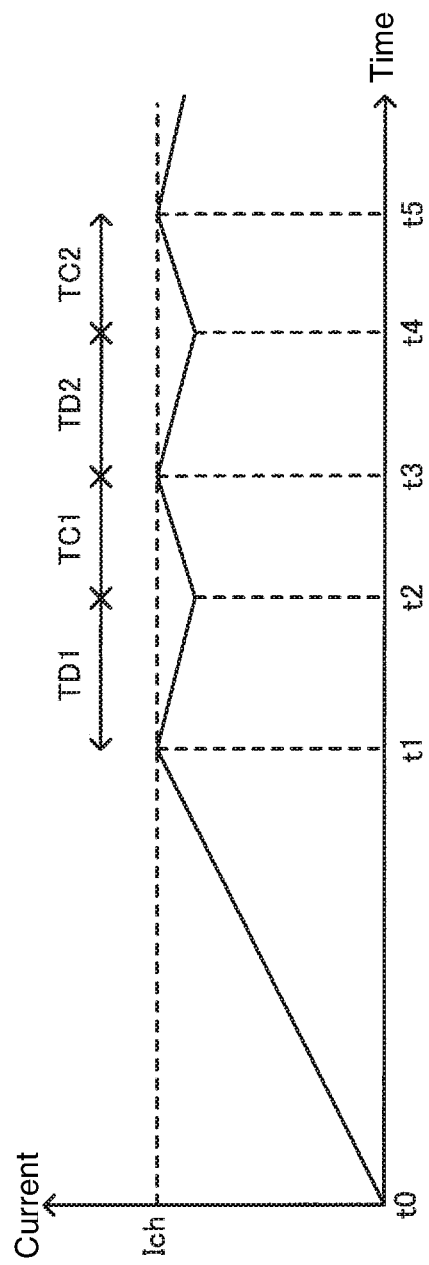
FIG. 6 is an explanatory diagram of the operation of the circuit device.

As shown in FIG. 6, it is assumed that driving of the motor 280 is started at time t0. When driving is started, a charge period starts as shown in FIG. 4, and the control circuit 240 turns on the transistors Q1 and Q4 and turns off the transistors Q2 and Q3. During the charge period, a drive current flows from the power supply voltage VBB to the ground voltage via the transistor Q1, the motor 280, the transistor Q4, and the sense resistor 290, as indicated by the solid arrow in FIG. 4.

The drive current increases with time, and the voltage VS converted by the sense resistor 290 also increases. Once the voltage VS exceeds the reference voltage VR, the output signal of the comparator 221 changes from the L level to the H level. As shown in FIG. 6, a drive current at this point in time (time t1) is the chopping current Ich. The chopping current Ich is thus detected by detection of the voltage VS.

In response to the change of the output signal of the comparator 221 to the H level, the control circuit 240 shifts to a decay period TD1. As shown in FIG. 5, during the decay period TD1, the control circuit 240 turns on the transistors Q2 and Q3 and turns off the transistors Q1 and Q4. A drive current (regenerative current) flows from the ground voltage to the power supply voltage VBB via the sense resistor 290, the transistor Q3, the motor 280, and the transistor Q2, as indicated by the dashed arrow in FIG. 5. As shown in FIG. 6, during the decay period TD1, the drive current decreases with time.

Detecting that a predetermined period of time has elapsed from the start of the decay period TD1 with, for example, a timer (counter circuit) or the like, the control circuit 240 shifts to a charge period TC1. During the charge period TC1, the drive current increases, and when the drive current reaches the chopping current Ich, the control circuit 240 shifts to a decay period TD2. After that, by repeating the above operation, the control circuit 240 performs control so as to keep the chopping current Ich constant, thereby keeping the rotational speed of the motor 280 constant.

It should be noted that although a case where the bridge circuit 210 is constituted by an H-bridge was described as an example above, the embodiment is not limited to this, and the bridge circuit 210 may also be constituted by a half bridge.

4. DMOS Transistor

Figure 7:
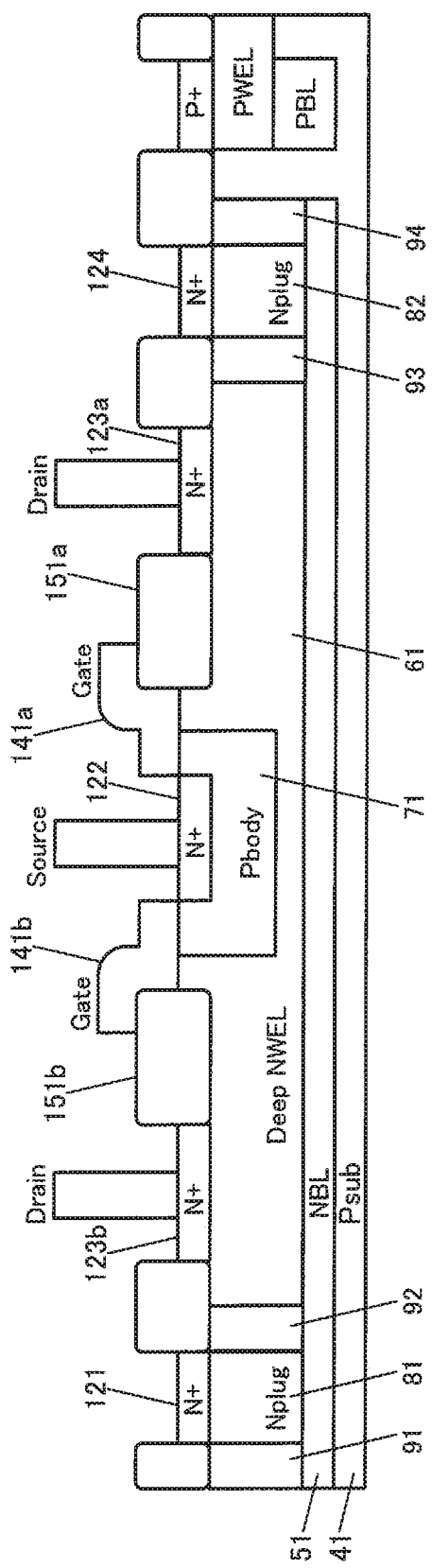
FIG. 7 shows a detailed example configuration of an N-type transistor having a DMOS structure.

FIG. 7 shows a detailed example configuration of an N-type transistor having a DMOS structure. FIG. 7 is a cross-sectional view of the substrate in the thickness direction thereof. It should be noted that like components as those described with reference to FIG. 2 are denoted by like reference numerals, and a description thereof is omitted as appropriate.

In this example configuration, the N-type transistor having the DMOS structure described with reference to FIG. 2 is configured symmetrically. That is, the N-type layer 122 corresponding to the source region is the center of symmetry, and gate layers 141a and 141b, insulating layers 151a and 151b, and N-type layers 123a and 123b corresponding to the drain regions are formed on both sides of the N-type layer 122. Similarly, the deep N-type well 61 and the P-type body 71 are each formed on the N-type buried layer 51 so as to be symmetrical, where the source is the center of symmetry. The N-type plugs 81 and 82 are formed on both sides of the deep N-type well 61.

Figure 8:
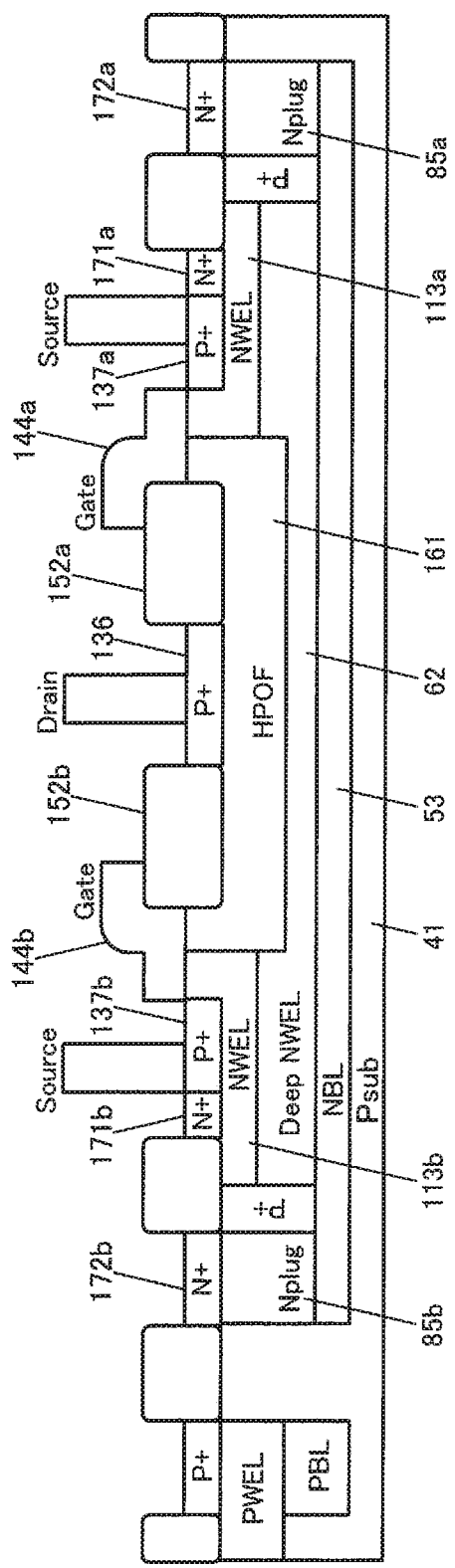
FIG. 8 shows a detailed example configuration of a P-type transistor having a DMOS structure.

FIG. 8 shows a detailed example configuration of a P-type transistor having a DMOS structure. FIG. 8 is a cross-sectional view of the substrate in the thickness direction thereof.

In this example configuration, each layer is configured symmetrically, where a P-type layer 136 corresponding to the drain region is the center of symmetry. More specifically, an N-type buried layer 53 is formed on the P-type substrate 41, and a deep N-type well 62 is formed on the N-type buried layer 53. An HPOF 161 (P-type impurity layer) is formed on a center portion of the deep N-type well 62, and the P-type layer 136 corresponding to the drain region is formed on the HPOF 161. N-type wells 113a and 113b (e.g., low-voltage N-type wells (LV NWEL)) are formed on both end portions of the deep N-type well 62, and N-type layers 171a and 171b as well as P-type layers 137a and 137b corresponding to the source regions are formed on the N-type wells 113a and 113b. Insulating layers 152a and 152b (e.g., LOCOS) are formed on both sides of the P-type layer 136 corresponding to the drain region, and gate layers 144a and 144b (e.g., polysilicon layers) are formed above the N-type wells 113a and 113b, the HPOF 161, and the insulating layers 152a and 152b.

A potential (e.g., power supply voltage) is supplied to the N-type buried layer 53 via N-type plugs 85a and 85b. The N-type plugs 85a and 85b are formed on both sides of the deep N-type well 62, and N-type layers 172a and 172b are formed on the N-type plugs 85a and 85b, respectively.

Note that as in the case of the N-channel, the P-type transistor having the DMOS structure may also be constituted by one gate of the two gates of the above symmetrical configuration and the drain.

5. Manufacturing Process

A process flow for manufacturing a transistor having a DMOS structure will be described using FIGS. 9A to 12C. Note that an N-type transistor is shown on the left side of the drawings, and a P-type transistor is shown on the right side of the drawings.

Figure 9A:
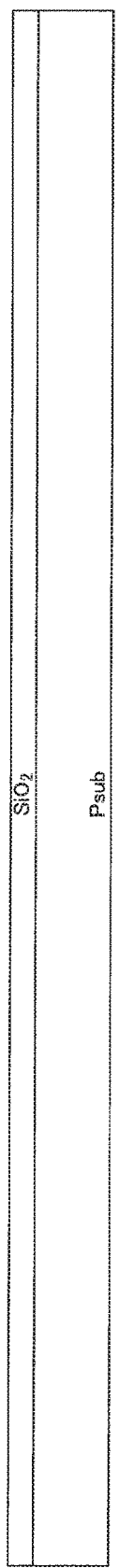
FIGS. 9A to 9E show a process flow for manufacturing a transistor having a DMOS structure.
Figure 9B:
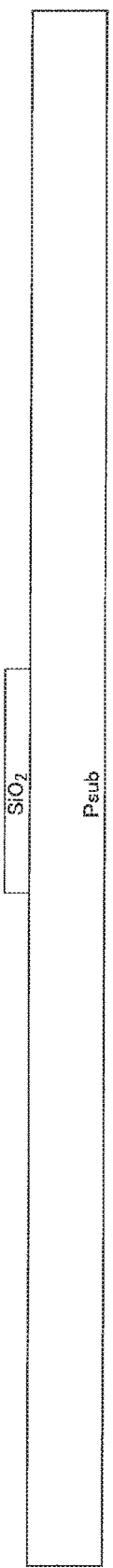
Figure 9C:
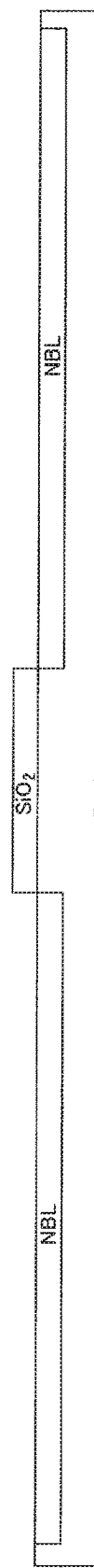

As shown in FIG. 9A, a step of forming an oxide film (SiO$_2$) on a P-type substrate (Psub) is performed. Then, as shown in FIG. 9B, a photolithography step is performed, and a step of etching the oxide film (SiO$_2$) in regions that are not covered by the resist is performed. Then, as shown in FIG. 9C, a step of implanting N-type ions into the P-type substrate (Psub) is performed, whereby N-type buried layers (NBL) are formed in the regions that are not covered by the oxide film (SiO$_2$).

Figure 9D:
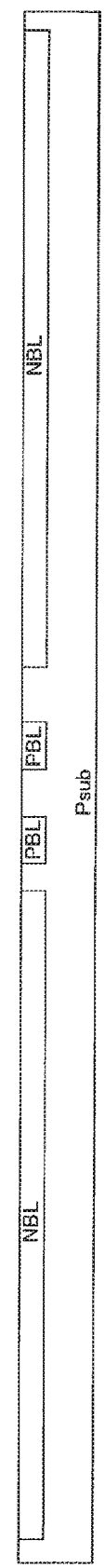
Figure 9E:
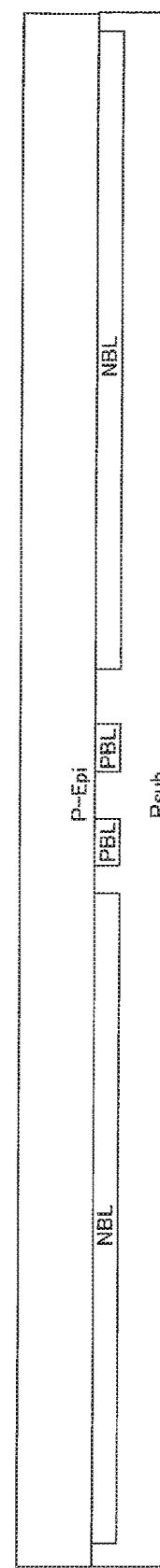

Then, as shown in FIG. 9D, an etching step is performed to remove the oxide film (SiO$_2$), and a photolithography step is performed. Then, a step of implanting P-type ions into the P-type substrate (Psub) is performed to form P-type buried layers (PBL) in regions that are not covered by the resist. Then, as shown in FIG. 9E, a step of forming a P-type epitaxial layer (P-Epi) on the P-type substrate (Psub) and the buried layers (NBL, PBL) is performed. In the above-described manner, the N-type buried layers (NBL) and the P-type buried layers (PBL) are formed under the P-type epitaxial layer (P-Epi).

Figure 10A:
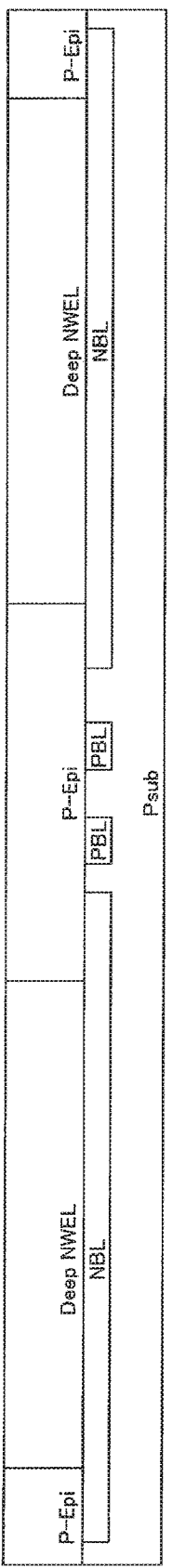
FIGS. 10A to 10D show a process flow for manufacturing the transistor having the DMOS structure.
Figure 10B:
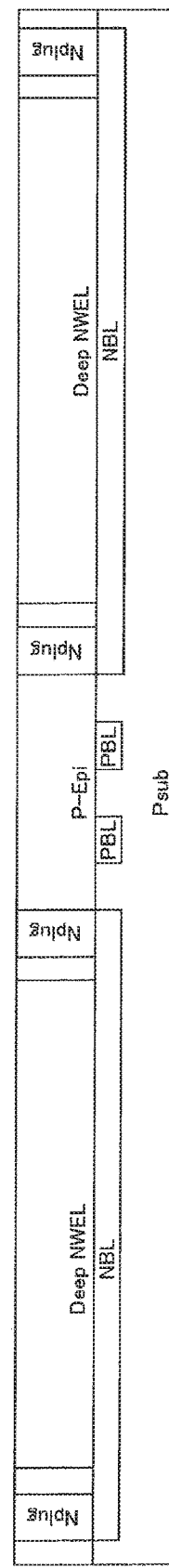

Then, as shown in FIG. 10A, a photolithography step and a step of implanting N-type ions into the P-type epitaxial layer (P-Epi) are performed, whereby deep N-type wells (Deep NWEL) are formed in regions that are not covered by the resist. Then, as shown in FIG. 10B, a photolithography step and a step of implanting N-type ions into the P-type epitaxial layer (P-Epi) are performed, whereby N-type plugs (Nplug) are formed in regions that are not covered by the resist.

Figure 10C:
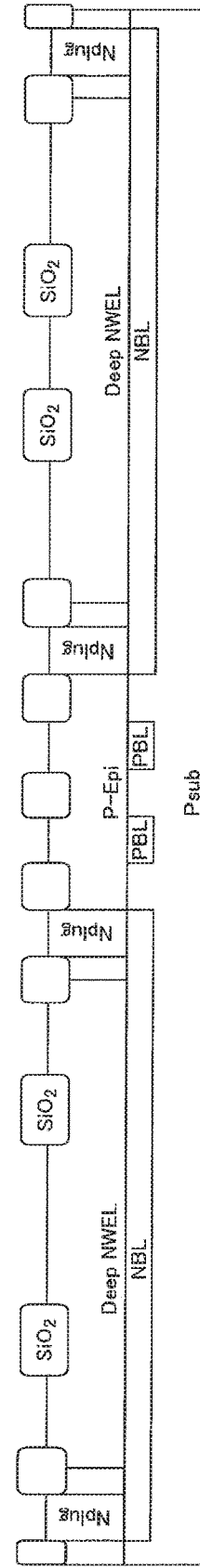
Figure 10D:
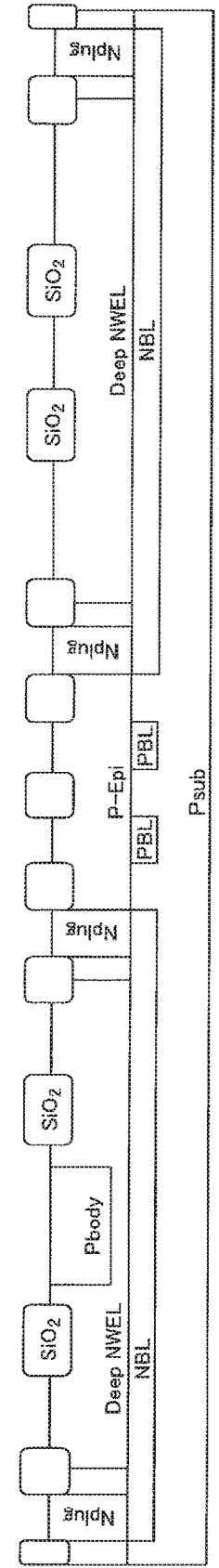

Then, as shown in FIG. 10C, a photolithography step and an etching step of a silicon nitride film are performed, and an oxide film forming step is performed, whereby LOCOS is performed where SiO$_2$ is formed. Then, as shown in FIG. 10D, a photolithography step and a step of implanting P-type ions into the deep N-type well (Deep NWEL) are performed, whereby a P-type body (Pbody) is formed in a region that is not covered by the resist.

Figure 11A:
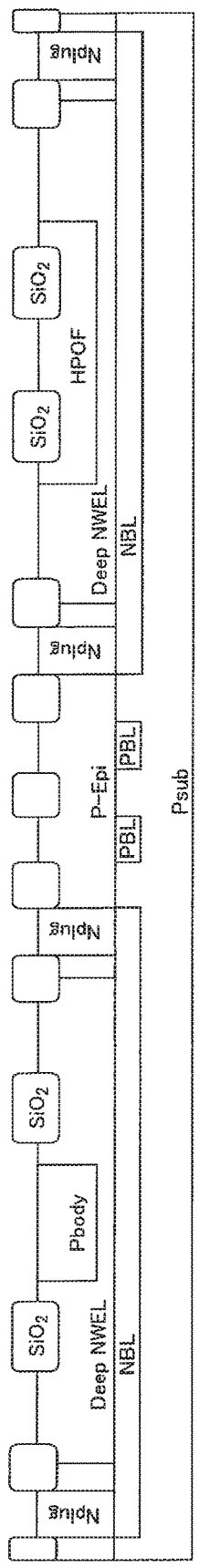
FIGS. 11A to 11C show a process flow for manufacturing the transistor having the DMOS structure.
Figure 11B:
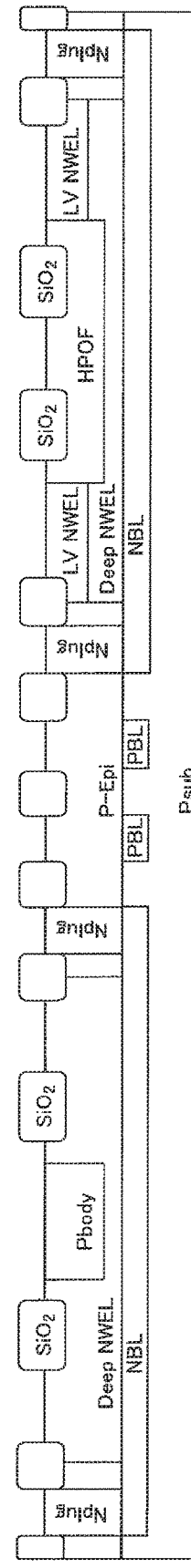
Figure 11C:
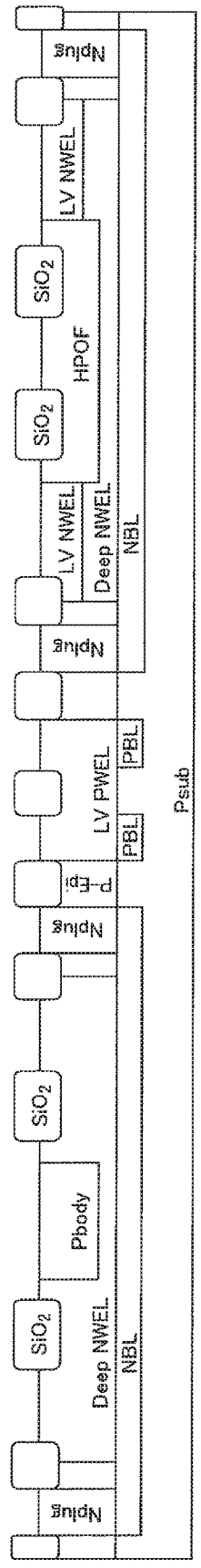

Then, as shown in FIG. 11A, a photolithography step and a step of implanting P-type ions into the deep N-type well (Deep NWEL) are performed, whereby an HPOF layer is formed in a region that is not covered by the resist. Then, as shown in FIG. 11B, a photolithography step and a step of implanting N-type ions into the deep N-type well (Deep NWEL) are performed, whereby low-voltage N-type wells (LV NWEL) are formed in regions that are not covered by the resist. Then, as shown in FIG. 11C, a photolithography step and a step of implanting P-type ions into the P-type epitaxial layer (P-Epi) are performed, whereby a low-voltage P-type well (LV PWEL) is formed in a region that is not covered by the resist.

Then, as shown in FIG. 12A, a step of forming polysilicon layers is performed, and a photolithography step and an etching step are performed, whereby gate layers (Poly) are formed. Then, as shown in FIG. 12B, a photolithography step and a step of implanting N-type ions are performed, whereby N-type impurity layers (N+) are formed in a surface portion of the substrate. The N-type impurity layers (N+) constitute the source region, the drain region, and the like of the N-type transistor. Then, as shown in FIG. 12C, a photolithography step and a step of implanting P-type ions are performed, whereby P-type impurity layers (P+) are formed in the surface portion of the substrate. The P-type impurity layers (P+) constitute the source region, the drain region, and the like of the P-type transistor. In the above-described manner, the N-type transistor (on the left side of the paper plane) having the DMOS structure and the P-type transistor (on the right side of the paper plane) having the DMOS structure are formed.

It should be noted that although a description of the manufacturing process for a transistor having a CMOS structure is omitted, a semiconductor substrate having both CMOS and DMOS structures can be formed using a single manufacturing flow by forming a layer that is common to the DMOS transistor and the CMOS transistor in the same step.

6. Electronic Apparatus

Figure 13:
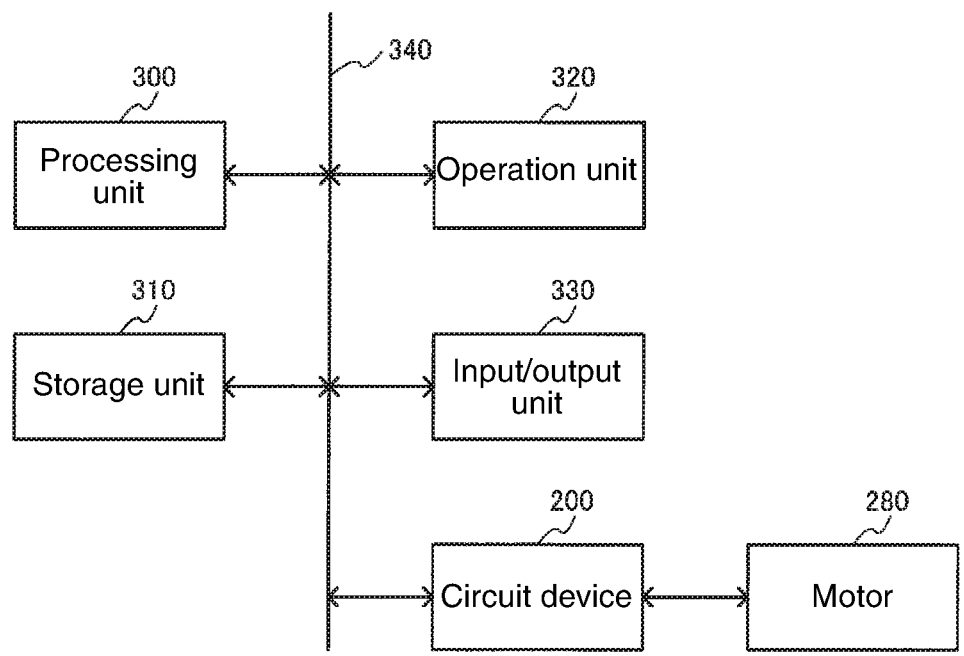
FIG. 13 shows an example configuration of an electronic apparatus.

FIG. 13 shows an example configuration of an electronic apparatus to which the circuit device 200 (motor driver) of this embodiment is applied. The electronic apparatus includes a processing unit 300, a storage unit 310, an operation unit 320, an input/output unit 330, the circuit device 200, a bus 340 that connects these units to one another, and a motor 280. Note that, while a printer where a head and a paper feeder are controlled by motor drive is to be described as an example, this embodiment is not limited to this, but can be applied to various types of electronic apparatuses.

The input/output unit 330 is constituted by interfaces such as a USB connector and wireless LAN, to which image data and document data are input. The input data is stored in the storage unit 310 which is an internal storage such as a DRAM, for example. When receiving a print instruction via the operation unit 320, the processing unit 300 starts printing of data stored in the storage unit 310. The processing unit 300 issues an instruction to the circuit device 200 (motor driver) in accordance with the print layout of the data, and the circuit device 200 rotates the motor 280 based on the instruction to execute movement of the head or paper feeding.

In this embodiment, since the circuit device 200 can keep the chopping current constant with high precision, errors in the movement of the head or the paper feeding can be prevented or reduced, permitting high-quality printing.

While a preferred embodiment of the invention has been described in detail, it is to be easily understood by those skilled in the art that various modifications that do not substantially depart from the novel matters and advantages of the invention may be made. It is therefore construed that all of such modifications are included in the scope of the invention. For example, a term having appeared together with a broader or synonymous different term at least once in the description or any drawing can be replaced with the different term at any position in the description or the drawings. Also, any combination of the preferred embodiment and the modifications is to be included in the scope of the invention. It is also to be understood that the configurations and operations of the circuit device, the substrate, and the electronic apparatus, the technique of controlling motor drive, the method of manufacturing the semiconductor substrate, etc. are not limited to those described in the preferred embodiment, but can be altered in various ways.

The entire disclosure of Japanese Patent Application No. 2013-041807, filed Mar. 4, 2013 is expressly incorporated by reference herein.

What is claimed is:

1. A circuit device comprising:
a P-type substrate;
a first region on the P-type substrate;
a second region on the P-type substrate;
a first boundary region located at one end of the first region;
a second boundary region located between the first region and the second region;
a first circuit constituted by a transistor that has a DMOS structure and located on a first N-type buried layer in the first region;
a second circuit constituted by a transistor that has a CMOS structure and is located on a second N-type buried layer in the second region and isolated from the first N-type buried layer;
a first N-type plug region located in the first boundary region and configured to set a potential of the first N-type buried layer;
a second N-type plug region located in the second boundary region and configured to set a potential of the first N-type buried layer;
a first P-type buried layer on a second region side of the second boundary region;
a P-type well on the first P-type buried layer;
a first P-type layer on the P-type well; and
second P-type layers in direct contact with both sides of the first N-type plug region and the second N-type plug region,
wherein the second N-type buried layer is configured to be set at a different potential than the first N-type buried layer.

2. The circuit device according to claim 1, wherein an N-type transistor of the transistor having the DMOS structure has:
a deep N-type well located on the first N-type buried layer;
a third P-type layer located on the deep N-type well;
an N-type source region located on the third P-type layer; and
an N-type drain region located on the deep N-type well.

3. The circuit device according to claim 1, wherein a P-type transistor of the transistor having the DMOS structure has:
a deep N-type well located on the first N-type buried layer;
a third P-type layer located on the deep N-type well;
a P-type source region located on the deep N-type well; and
a P-type drain region located on the third P-type layer.

4. The circuit device according to claim 1, wherein the first circuit has a bridge circuit that outputs a chopping current for driving a motor, and the second circuit has a detection circuit that detects a current flowing to the bridge circuit.

5. The circuit device according to claim 4, wherein the detection circuit has:
the reference voltage generation circuit;
a voltage detection circuit that compares a voltage based on the current with the reference voltage; and
a control circuit that controls the bridge circuit based on a comparison result of the voltage detection circuit.

6. The circuit device according to claim 1, wherein the second circuit has a circuit that controls the first circuit or a circuit that detects a voltage or a current of the first circuit.

7. The circuit device according to claim 1, wherein the first circuit is a circuit that performs an operation of repeatedly switching an output current or an output voltage.

8. An electronic apparatus comprising the circuit device according to claim 1.

9. The circuit device according to claim 1, wherein the first N-type plug region surrounds the first region.

10. The circuit device according to claim 9, wherein the second N-type plug region and the first N-type plug region are configured to receive different potentials.

11. The circuit device according to claim 1, further comprising:
a P-type epitaxial layer that corresponds to the P-type layers,
wherein the second N-type plug region is located in the P-type epitaxial layer.

12. A circuit device comprising:
a P-type substrate;
a first region on the P-type substrate;
a second region on the P-type substrate;
a boundary region located between the first region and the second region;
a first circuit constituted by a transistor that has a DMOS structure and located on a first N-type buried layer in the first region;
a second circuit constituted by a transistor that has a CMOS structure and located on a first P-type layer that is located on a second N-type buried layer in the second region and isolated from the first N-type buried layer;
a P-type buried layer on a second region side of the boundary region;
a P-type well on the P-type buried layer; and
a second P-type layer on the P-type well,
wherein the second N-type buried layer is configured to be set at a higher potential than the P-type substrate to electrically isolate the second circuit from the P-type substrate by a reverse-voltage PN junction.

13. The circuit device according to claim 12, wherein the first P-type layer is a P-type buried layer.

14. The circuit device according to claim 13, wherein there is no P-type buried layer located on the first N-type buried layer.

15. The circuit device according to claim 12, further comprising:
a pad through which a potential applied to the P-type substrate is configured to be supplied;
a first interconnect that is configured to supply a potential from the pad to the P-type layer; and
a second interconnect that is configured to supply a potential from the pad to the P-type substrate.

16. The circuit device according to claim 12, wherein a P-type transistor of the transistor having the CMOS structure is constituted by an N-type well located on the first P-type layer, a P-type source region located on the N-type well, and a P-type drain region located on the N-type well, and an N-type transistor of the transistor having the CMOS structure is constituted by a P-type well located on the first P-type layer, an N-type source region located on the P-type well, and an N-type drain region located on the P-type well.

17. The circuit device according to claim 12, wherein the first P-type layer and the P-type substrate are configured to be set at equal potentials.

\* \* \* \* \*